(12) United States Patent
Lan et al.

(10) Patent No.: US 11,393,800 B2
(45) Date of Patent: Jul. 19, 2022

(54) DISPLAY DEVICE AND MANUFACTURING METHOD OF DISPLAY DEVICE

(71) Applicant: Au Optronics Corporation, Hsinchu (TW)

(72) Inventors: Yi-Fen Lan, Hsinchu (TW); Tsung-Tien Wu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 6 days.

(21) Appl. No.: 16/990,983

(22) Filed: Aug. 11, 2020

(65) Prior Publication Data
US 2021/0225820 A1 Jul. 22, 2021

(30) Foreign Application Priority Data
Jan. 20, 2020 (TW) .................. 109101856

(51) Int. Cl.
*H01L 25/13* (2006.01)
*H01L 23/00* (2006.01)

(52) U.S. Cl.
CPC .............. *H01L 25/13* (2013.01); *H01L 24/97* (2013.01)

(58) Field of Classification Search
CPC ............... H01L 25/13; H01L 24/97; H01L 2221/68363; H01L 2221/68309; H01L 33/0095; H01L 24/95; H01L 21/6835; H01L 33/62; H01L 33/52; H01L 25/0753; H01L 25/167; H01L 25/50; H01L 21/67781; H01L 25/0756; G01R 31/2635
See application file for complete search history.

(56) References Cited

U.S. PATENT DOCUMENTS

| | | | |
|---|---|---|---|
| 7,148,127 B2 | 12/2006 | Oohata et al. | |
| 7,723,764 B2 | 5/2010 | Oohata et al. | |
| 8,101,432 B2 | 1/2012 | Oohata et al. | |
| 8,791,474 B1 | 7/2014 | Bibi et al. | |
| 10,636,772 B1* | 4/2020 | Ray | H01L 33/62 |
| 2003/0011377 A1* | 1/2003 | Oohata | G09G 3/006 |
| | | | 324/512 |
| 2006/0202213 A1 | 9/2006 | Oohata et al. | |
| 2006/0240578 A1 | 10/2006 | Oohata et al. | |

(Continued)

FOREIGN PATENT DOCUMENTS

| | | |
|---|---|---|
| CN | 108321169 | 6/2020 |
| TW | 558757 | 10/2003 |

*Primary Examiner* — Bilkis Jahan
*Assistant Examiner* — Victor V Barzykin
(74) *Attorney, Agent, or Firm* — JCIPRNET (57) ABSTRACT

A display device and a manufacturing method of a display device are provided. The display device includes a substrate, a plurality of first light-emitting elements, and at least one second light-emitting element. The first light-emitting elements are arranged on the substrate. A plurality of first electrodes are provided on a surface of each of the first light-emitting elements facing away from the substrate. The second light-emitting element is disposed on the substrate. A plurality of second electrodes are provided on a surface of the second light-emitting element facing away from the substrate. An orthographic projection of the second light-emitting element on the substrate partially overlaps orthographic projections of the first light-emitting elements on the substrate.

15 Claims, 13 Drawing Sheets

(56) References Cited

U.S. PATENT DOCUMENTS

| | | | |
|---|---|---|---|
| 2010/0051975 A1* | 3/2010 | Suzuki | H01L 25/0756 257/89 |
| 2011/0186876 A1* | 8/2011 | Suzuki | H01L 25/0756 257/89 |
| 2012/0165759 A1* | 6/2012 | Rogers | H01L 23/3192 604/264 |
| 2014/0264405 A1* | 9/2014 | Brindisi | H01L 27/3213 257/89 |
| 2015/0357315 A1* | 12/2015 | Oraw | G09G 3/32 315/294 |
| 2018/0090469 A1* | 3/2018 | Hanya | H01L 25/50 |
| 2019/0172761 A1 | 6/2019 | Guo et al. | |
| 2019/0189681 A1* | 6/2019 | Chae | H01L 33/24 |
| 2019/0206849 A1* | 7/2019 | Jang | H01L 33/405 |
| 2020/0350298 A1* | 11/2020 | Chen | H01L 33/62 |

\* cited by examiner

DISPLAY DEVICE AND MANUFACTURING METHOD OF DISPLAY DEVICE

CROSS-REFERENCE TO RELATED APPLICATION

This application claims the priority benefit of Taiwan application serial no. 109101856, filed on Jan. 20, 2020. The entirety of the above-mentioned patent application is hereby incorporated by reference herein and made a part of this specification.

BACKGROUND OF THE DISCLOSURE

1. Field of the Disclosure

The disclosure relates to a device and a manufacturing method of a device, and in particular, to a display device and a manufacturing method of a display device.

2. Description of Related Art

A light-emitting element array display device consists of a plurality of light-emitting elements that are arranged in an array and that are disposed on a substrate. In view of characteristics of current light-emitting elements, the light-emitting element array display device has advantages such as power saving, high efficiency, high brightness, and a short response time. However, when the display device is manufactured, problems such as misalignment, tilt, or even omission of the light-emitting elements often occur when the light-emitting elements are transferred to a substrate in batches. According to the previous method, a transfer head needs to be replaced to remove defective light-emitting elements one by one for retransferring, which will consume a lot of process time.

SUMMARY OF THE DISCLOSURE

The disclosure provides a display device and a manufacturing method of a display device, which can alleviate the problem of high process costs.

The display device of the disclosure includes a substrate, a plurality of first light-emitting elements, and at least one second light-emitting element. The first light-emitting elements are arranged on the substrate. A plurality of first electrodes are provided on the surface of each of the plurality of first light-emitting elements facing away from the substrate. The second light-emitting element is disposed on the substrate. A plurality of second electrodes are provided on the surface of the second light-emitting element facing away from the substrate. An orthographic projection of the second light-emitting element on the substrate partially overlaps orthographic projections of the first light-emitting elements on the substrate.

Another display device of the disclosure includes a substrate, a plurality of first light-emitting elements, and at least one second light-emitting element. The first light-emitting elements are arranged on the substrate. The second light-emitting element is disposed on the substrate. The second light-emitting element is electrically independent. An orthographic projection of the second light-emitting element on the substrate partially overlaps orthographic projections of the first light-emitting elements on the substrate.

In an embodiment of the disclosure, the second light-emitting element is located between the first light-emitting elements and the substrate.

In an embodiment of the disclosure, the display device further includes an adhesion layer. The first light-emitting elements and the second light-emitting element are fixed onto the substrate via the adhesion layer, and a thickness of the adhesion layer is larger than a sum of a thickness of one of the first light-emitting elements and a thickness of the second light-emitting element.

In an embodiment of the disclosure, the display device further includes a plurality of island-shaped pads. The adhesion layer includes a plurality of openings. Each of the plurality of island-shaped pads is located in a corresponding one of the plurality of openings. Each of the plurality of island-shaped pads is electrically connected to a corresponding one of the first electrodes. A height of each of the island-shaped pads is smaller than or equal to a half of a thickness of the adhesion layer.

In an embodiment of the disclosure, the display device further includes a first adhesion layer and a second adhesion layer. The first adhesion layer is located between the substrate and the second adhesion layer. The first light-emitting elements and the second light-emitting element are fixed onto the substrate via the first adhesion layer and the second adhesion layer, and the second light-emitting element is located between the first adhesion layer and the second adhesion layer.

In an embodiment of the disclosure, the display device further includes a plurality of island-shaped pads. The first adhesion layer includes a plurality of first openings. The second adhesion layer includes a plurality of second openings. Each of the plurality of first openings overlaps a corresponding one of the second openings. Each of the island-shaped pads is located in a corresponding one of the first openings and a corresponding one of the second openings. Each of the island-shaped pads is electrically connected to a corresponding one of the first electrodes. A height of each of the island-shaped pads is smaller than or equal to a sum of a thickness of the first adhesion layer and a thickness of one of the first light-emitting elements.

A manufacturing method of a display device of the disclosure includes the following steps: performing, by using a transfer head, a plurality of first transfers to arrange a plurality of first light-emitting elements on a substrate, the plurality of first light-emitting elements being transferred through each of the first transfers; performing checking, and marking a position of at least one of the plurality of first light-emitting elements that includes a poor posture; and performing, by using the transfer head, a second transfer for the at least one of the first light-emitting elements that includes the poor gesture, such that the transfer head covers the at least one of the original first light-emitting elements that includes the poor posture in an area involved during the second transfer by using a new first light-emitting element.

In an embodiment of the disclosure, before the first transfer is performed, the method further includes: forming a first adhesion layer on the substrate, the first light-emitting elements being transferred onto the first adhesion layer through the first transfer.

In an embodiment of the disclosure, after the checking is performed and before the original first light-emitting elements are covered, the method further includes: forming a second adhesion layer on the first adhesion layer, the second adhesion layer covering the at least one of the first light-emitting elements that includes a poor posture.

Based on the foregoing, according to the display device and the manufacturing method of the display device of the disclosure, the light-emitting element with the poor posture is covered by a new light-emitting element instead of being removed, which can shorten the process time to reduce manufacturing costs.

DESCRIPTION OF THE EMBODIMENTS

Figure 1A:
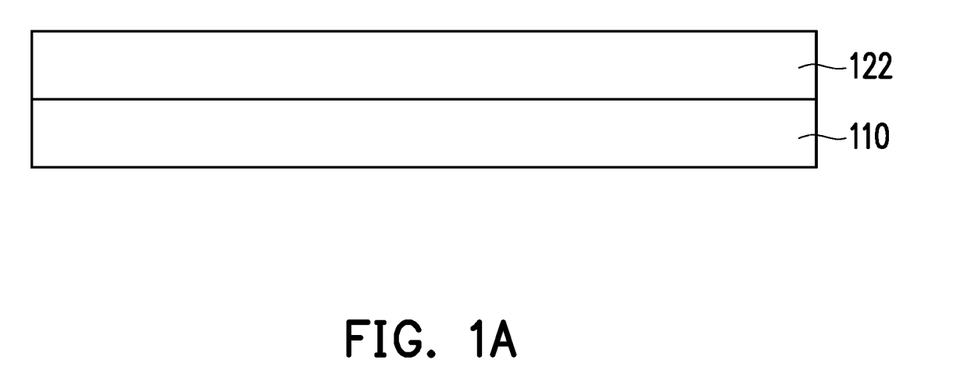
FIG. 1A to FIG. 1F is each a schematic cross-sectional diagram of a process of a manufacturing method of a display device according to an embodiment of the disclosure.

FIG. 1A to FIG. 1F is each a schematic cross-sectional diagram of a process of a manufacturing method of a display device according to an embodiment of the disclosure. A manufacturing method of a display device in this embodiment includes the following steps. Referring to FIG. 1A, a substrate 110 is provided first. Alternatively, a first adhesion layer 122 may be first formed on the substrate 110.

Figure 1B:
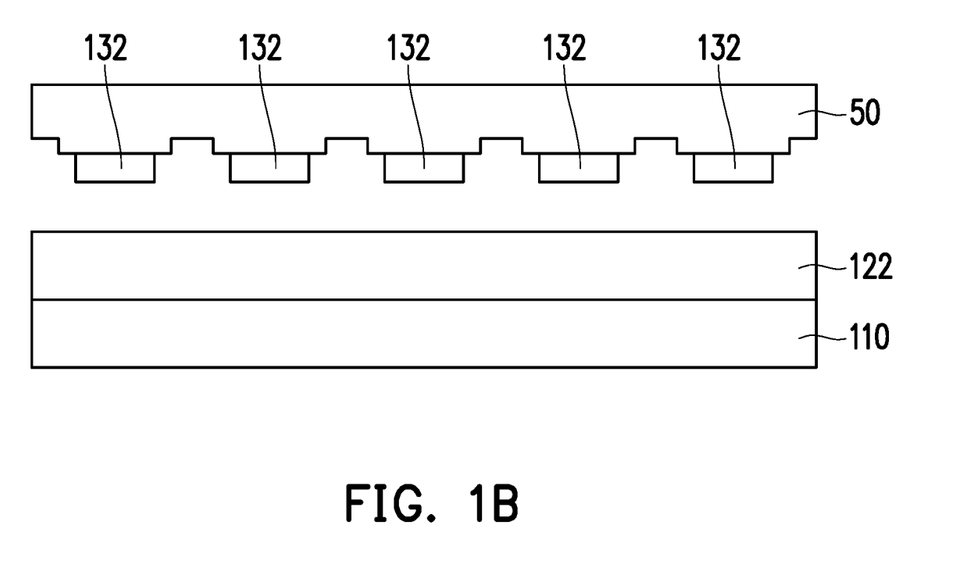

Then referring to FIG. 1B, a transfer head 50 is used to perform a plurality of first transfers to arrange a plurality of first light-emitting elements 132 on the substrate 110. When the first adhesion layer 122 exists, the first light-emitting elements 132 are transferred to the first adhesion layer 122 through the first transfer, and the first adhesion layer 122 may provide an appropriate positioning effect. A plurality of first light-emitting elements 132 are transferred through each of the first transfers. In FIG. 1B, only a range that may be covered by the transfer head 50 during the first transfer is schematically shown. The transfer head 50 needs to perform a plurality of first transfers to arrange all of the first light-emitting elements 132 on the entire substrate. For example, if 8 million first light-emitting elements 132 need to be arranged on the substrate 110, and 40 thousand first light-emitting elements 132 may be transferred by the transfer head 50 during the first transfer operation, then 200 first transfers need to be performed to arrange all of the first light-emitting elements 132 on the entire substrate.

Figure 1C:
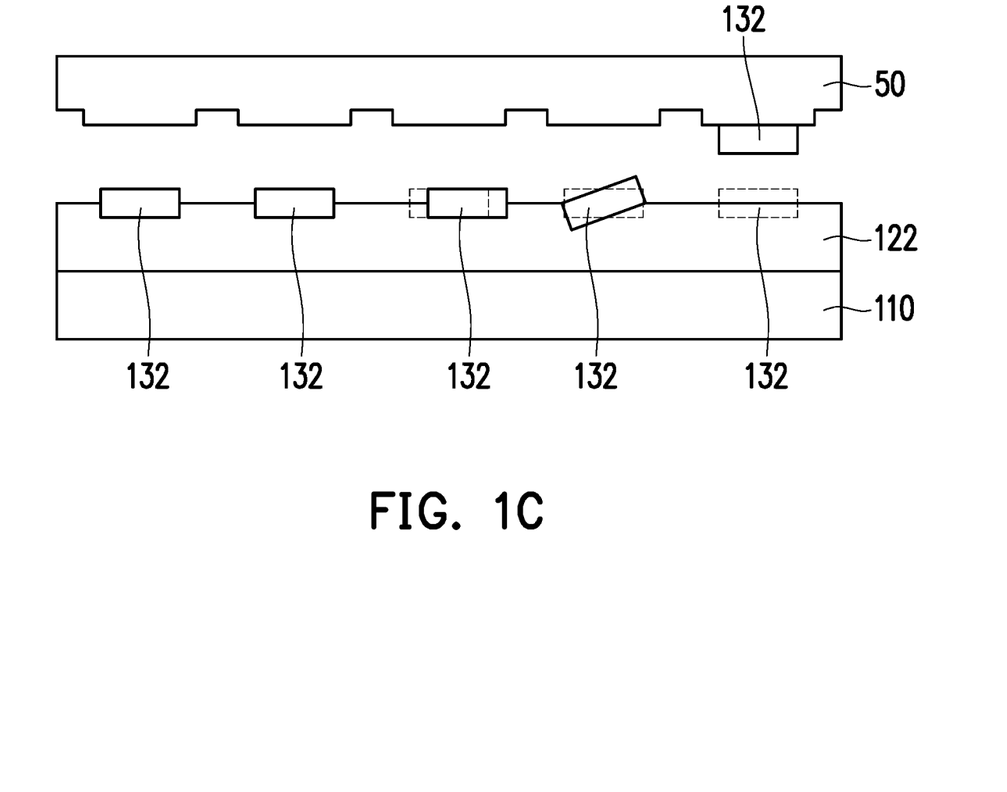

Next, referring to FIG. 1C, checking is performed, and a position of at least one of the first light-emitting elements 132 that has a poor posture is marked. A normal position of the first light-emitting elements 132 is indicated by using a dotted box in FIG. 1C. In FIG. 1C, for example, a position of one first light-emitting element 132 is deviated, a posture of one first light-emitting element 132 is inclined, another first light-emitting element 132 is not successfully transferred from the transfer head 50 to the substrate 110, and the positions and the postures of the two first light-emitting elements 132 on the left in FIG. 1C are normal.

Figure 1D:
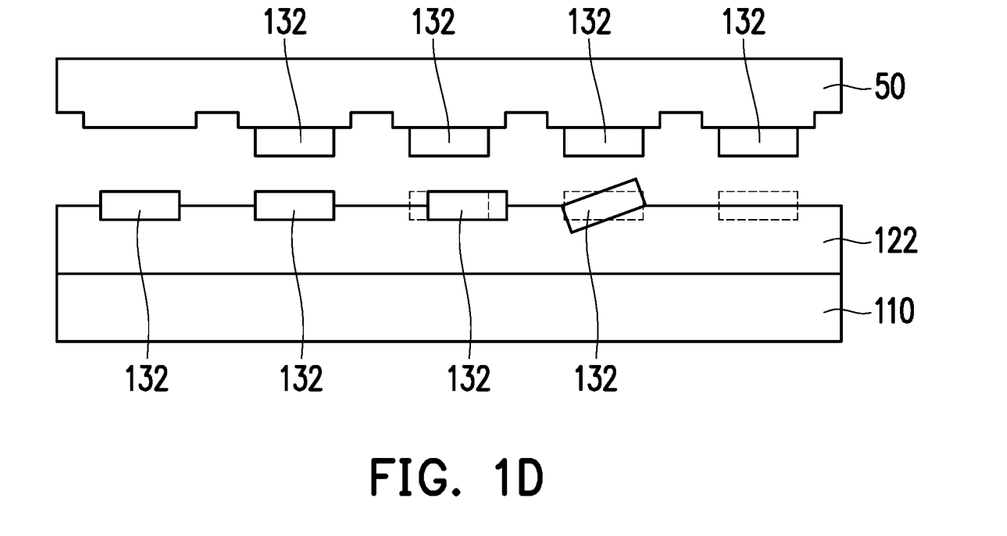
Figure 1E:
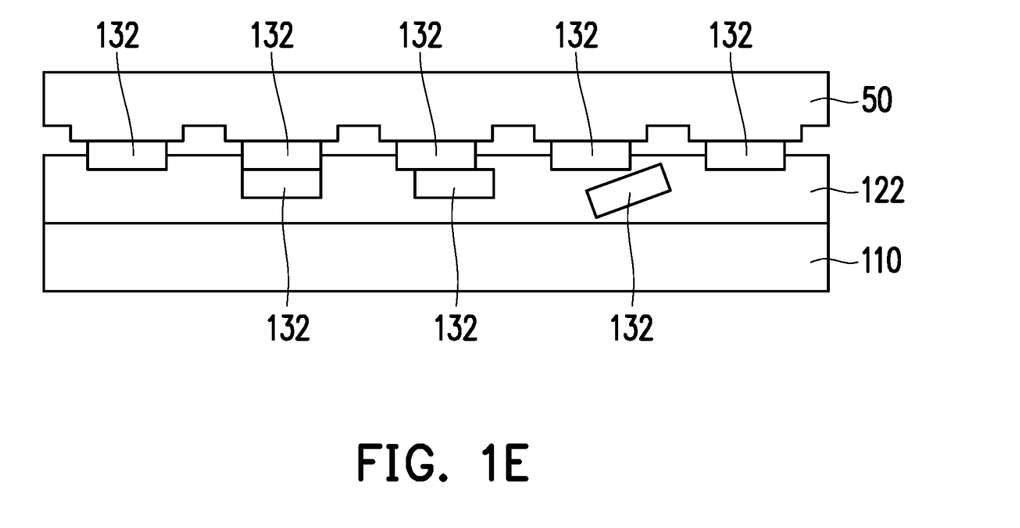

Next, the transfer head 50 is used to perform a second transfer for the position of the at least one of the first light-emitting elements 132 that has the poor posture. In FIG. 1D, a new first light-emitting element 132 is provided on the transfer head 50 and is aligned with a position to be transferred. Next, referring to FIG. 1E, when the second transfer is performed, the at least one of the original first light-emitting elements 132 that has the poor posture in an area covered by the transfer head 50 is covered by a new first light-emitting element 132. In this embodiment, most of the original first light-emitting elements 132 in the area covered by the transfer head 50 are covered by the new first light-emitting elements 132, and only the leftmost one light-emitting element 132 in FIG. 1E is not covered by the new first light-emitting element 132. That is to say, the leftmost first light-emitting element 132 in FIG. 1E is the first light-emitting element 132 that has been placed in the step shown in FIG. 1C, and the rightmost first light-emitting element 132 in FIG. 1E is the first light-emitting element 132 that has been transferred from the transfer head 50 to the substrate 110 in the step shown in FIG. 1E. In this way, the usage of the first light-emitting element 132 can be saved. However, in other embodiments, all of the original first light-emitting elements 132 in the area covered by the transfer head 50 are covered by the new first light-emitting elements 132. In this way, the transfer head 50 can pick up the first light-emitting element 132 more quickly, because it is not necessary to select whether to pick up the first light-emitting element 132 according to the positions. Finally, referring to FIG. 1F, the transfer head 50 is removed, and the display device 100 is manufactured.

It may be learned from the above that, according to the manufacturing method of the display device in this embodiment, either the first transfer or the second transfer is performed using the same transfer head 50, which may save the process time and costs required to replace the transfer head. In addition, when the second transfer is performed, all first light-emitting elements with problematic positions in the area covered by the transfer head 50 are covered by the new first light-emitting element 132 at once without being transferred one by one, which may shorten the process time.

In the foregoing embodiment, when the second transfer is performed, all of the original first light-emitting elements 132 in the area covered by the transfer head 50 are covered by the new first light-emitting element 132, which may save time required to selectively pick up the new first light-emitting element 132 before the second transfer is performed. However, in other embodiments, the new first light-emitting element 132 may be covered only at problematic positions to save the material costs, but new first light-emitting elements 132 are still covered at the problematic positions in the area covered by the transfer head 50 during the second transfer. In addition, the number of times for which the second transfer needs to be performed may be determined after checking and marking the position of the at least one of the first light-emitting elements 132 that has the poor posture. For example, the least quantity of second transfers is calculated for how to cover all marked positions. Before the checking and the marking are performed, the first light-emitting elements 132 are not wired. Therefore, whether each of the first light-emitting elements 132 is a good product is not determined by using a lighting test method. Instead, whether the postures of the first light-emitting elements 132 are good is determined by a checking device by using an optical means. Therefore, the first light-emitting elements 132 covered during the second transfer are not wired, but are in an electrically independent state, that is, in a floating state.

Referring to FIG. 1F again, a display device 100 in an embodiment of the disclosure includes a substrate 110, a plurality of first light-emitting elements 132, and at least one second light-emitting element 134. It is noted herein that the second light-emitting element 134 is the original first light-emitting element 132 covered by the new first light-emitting element 132 by using the foregoing manufacturing method. The first light-emitting elements 132 are arranged on the substrate 110. A plurality of first electrodes 132A are provided on the surface of each of the first light-emitting elements 132 facing away from the substrate 110 (only shown in FIG. 1F). The second light-emitting element 134 is disposed on the substrate 110. A plurality of second electrodes 134A are provided on the surface S14 of the second light-emitting element 134 facing away from the substrate 110 (only shown in FIG. 1F). An orthographic projection P12 of the second light-emitting element 134 on the substrate 110 partially overlaps orthographic projections P14 of the first light-emitting elements 132 on the substrate 110.

Figure 1F:
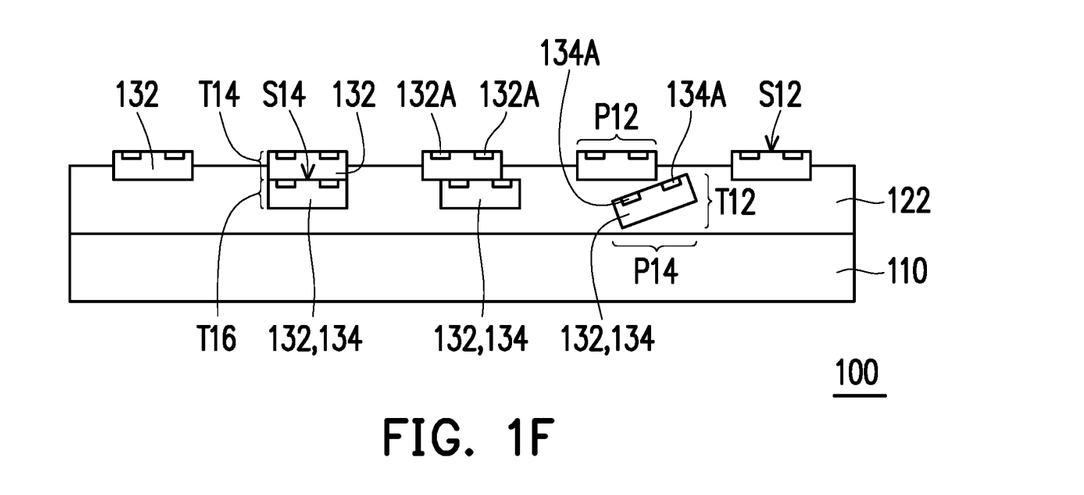

In the display device 100 of this embodiment, the first electrodes 132A of the first light-emitting elements 132 and the second electrodes 134A of the second light-emitting element 134 are all located on the surfaces facing away from the substrate 110, and the second light-emitting element 134 partially overlaps the first light-emitting elements 132. In other words, the second light-emitting element 134 does not play a display function in a final product. The display device 100 in this embodiment has the advantage of lower process costs.

A display device of another embodiment of the disclosure may also be described by referring to FIG. 1F. The display device 100 in this embodiment includes a substrate 110, a plurality of first light-emitting elements 132, and at least one second light-emitting element 134. It is noted herein that the second light-emitting element 134 is the original first light-emitting element 132 covered by the new first light-emitting element 132 by using the foregoing manufacturing method. The first light-emitting elements 132 are arranged on the substrate 110. The second light-emitting element 134 is disposed on the substrate 110. The second light-emitting element 134 is electrically independent. In other words, the second light-emitting element 134 is not electrically connected to any other element, that is, in a floating state. An orthographic projection P12 of the second light-emitting element 134 on the substrate 110 partially overlaps orthographic projections P14 of the first light-emitting elements 132 on the substrate 110.

In the display device 100 in this embodiment, the second light-emitting element 134 is electrically independent, and the second light-emitting element 134 partially overlaps the first light-emitting elements 132. In other words, the second light-emitting element 134 does not play a display function in a final product. The display device 100 in this embodiment has the advantage of lower process costs.

In the foregoing embodiment, the second light-emitting element 134 is located between the first light-emitting elements 132 and the substrate 110. In addition, the first light-emitting elements 132 and the second light-emitting element 134 are fixed onto the substrate 110 via a first adhesion layer, for example. A thickness T12 of the first adhesion layer 110 is larger than a sum of a thickness T14 of one first light-emitting element 132 and a thickness T16 of one second light-emitting element 134. With the first adhesion layer 110 having the thickness T12, collisions occurred between the first light-emitting elements 132, the second light-emitting element 134, and the substrate 110 during the second transfer may be avoided, thereby avoiding damage.

Figure 2A:
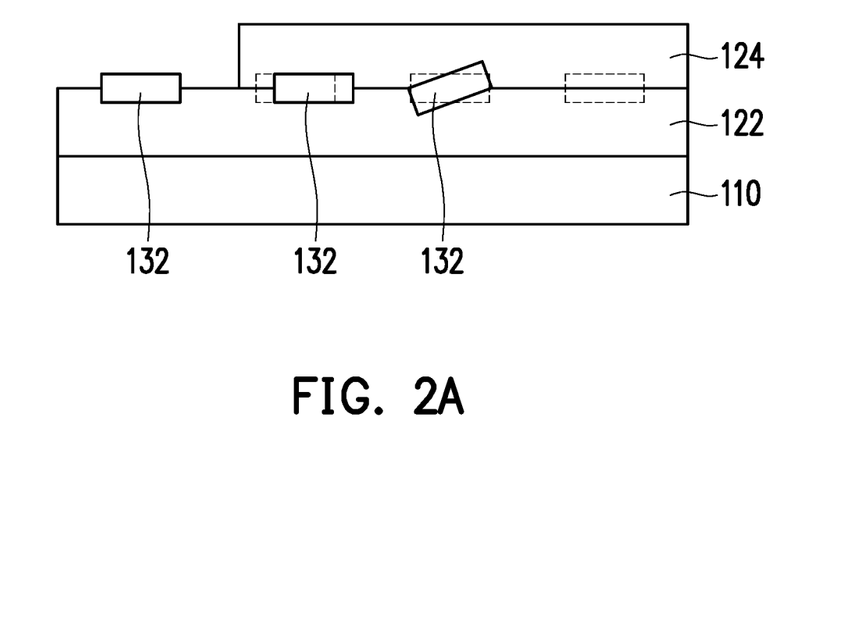
FIG. 2A to FIG. 2C is each a schematic cross-sectional diagram of a part of a process of a manufacturing method of a display device according to another embodiment of the disclosure.
Figure 2B:
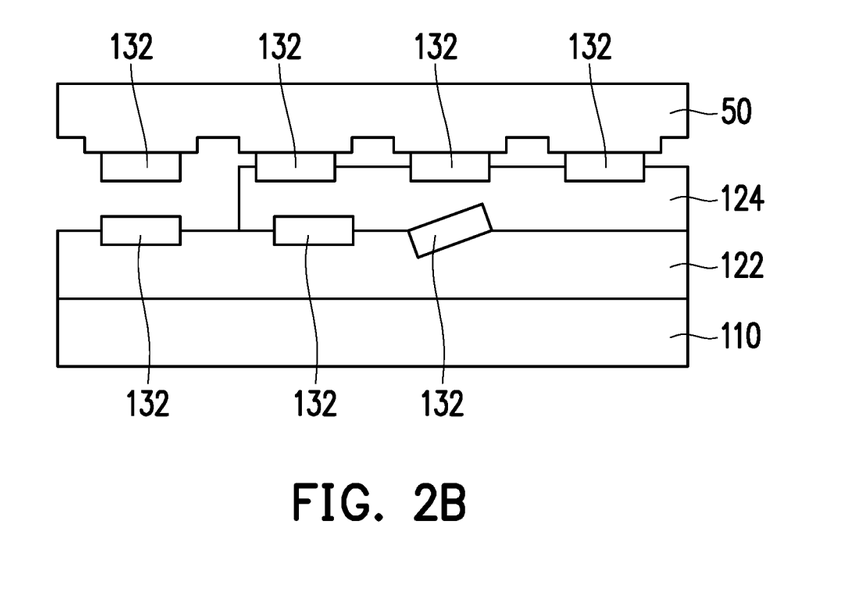
Figure 2C:
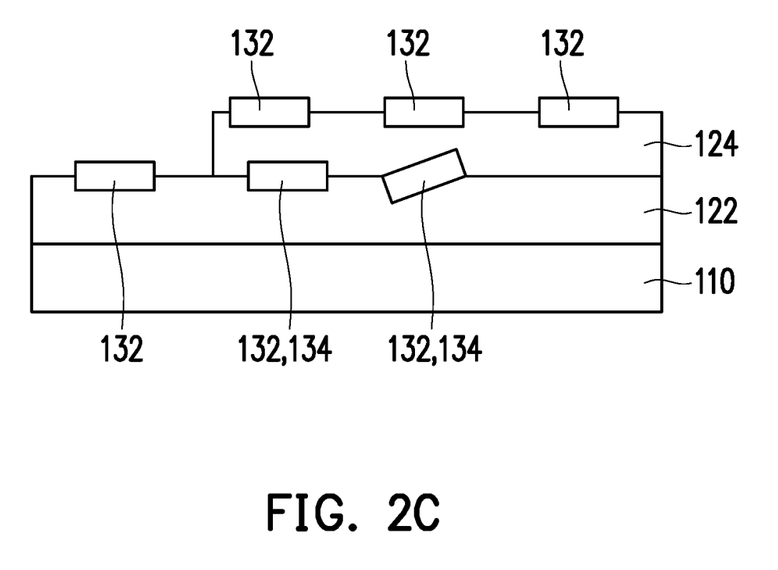

FIG. 2A to FIG. 2C is each a schematic cross-sectional diagram of a part of a process of a manufacturing method of a display device according to another embodiment of the disclosure. The manufacturing method of the display device in this embodiment is substantially the same as that in the embodiments of FIG. 1A to FIG. 1F, and only differences between the two are described herein. Referring to FIG. 2A, the manufacturing method of the display device in this embodiment may include the steps of FIG. 1A to FIG. 1C. Next, as shown in FIG. 2A, a second adhesion layer 124 is formed on a first adhesion layer 122. The second adhesion layer 124 at least covers at least one of the first light-emitting elements 132 that has a poor posture. For example, only those with a good posture in the first light-emitting elements 132 may not be covered by the second adhesion layer 124. Next, referring to FIG. 2B, when the second transfer is performed, the original first light-emitting elements 132 covered by the second adhesion layer 124 in an area covered by the transfer head 50 are covered by new first light-emitting elements 132. It may be learned from FIG. 2B that, there are also new first light-emitting elements 132 even at positions that do not correspond to the second adhesion layer 124 on the transfer head 50. Therefore, before the second transfer is performed by using the transfer head, all the first light-emitting elements 132 may be picked up without deliberately avoiding positions that do not correspond to the second adhesion layer 124, which may increase the process speed. In addition, the new first light-emitting elements 132 at the positions that do not correspond to the second adhesion layer 124 will not be transferred to the second adhesion layer 124.

Next, referring to FIG. 2C, the original first light-emitting elements 132 are fixed onto the substrate 110 via the first adhesion layer 122, and the new first light-emitting elements 132 are fixed onto the substrate 110 via the first adhesion layer 122 and the second adhesion layer 124. The second light-emitting element 134 is located between the first adhesion layer 122 and the second adhesion layer 124. The second light-emitting element 134 is the original first light-emitting element 132 covered by the new first light-emitting element 132 by using the foregoing manufacturing method. In this embodiment, since the second adhesion layer 124 is formed first, damage that may be generated when the new first light-emitting element 132 is in contact with the second light-emitting element 134 may be further reduced.

Figure 3A:
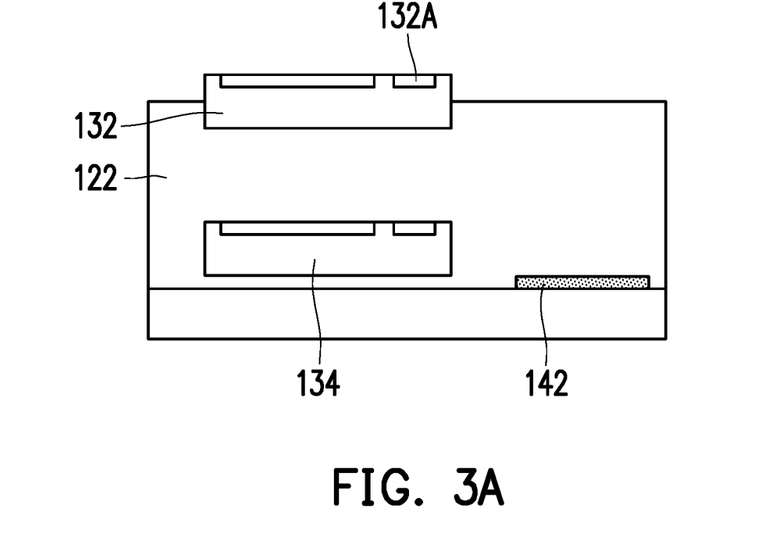
FIG. 3A to FIG. 3I is each a schematic cross-sectional diagram of a wiring process of a manufacturing method of a display device according to an embodiment of the disclosure.
Figure 3B:
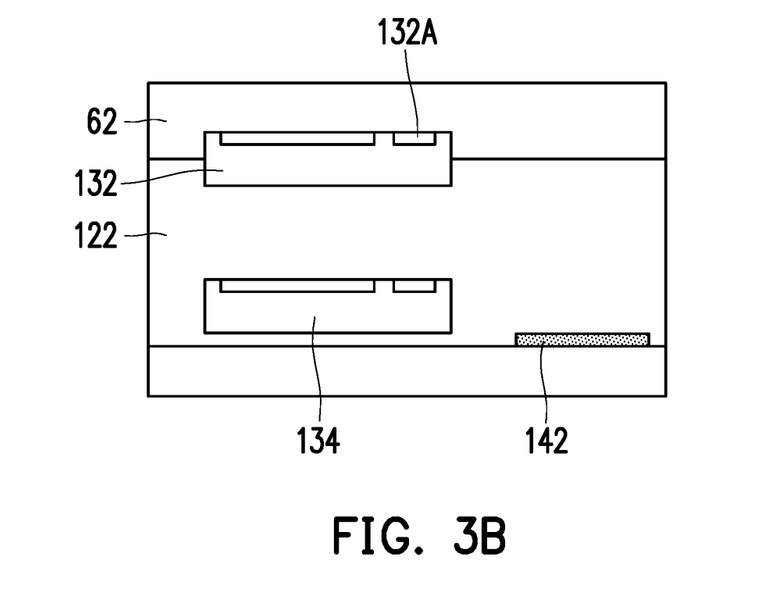
Figure 3C:
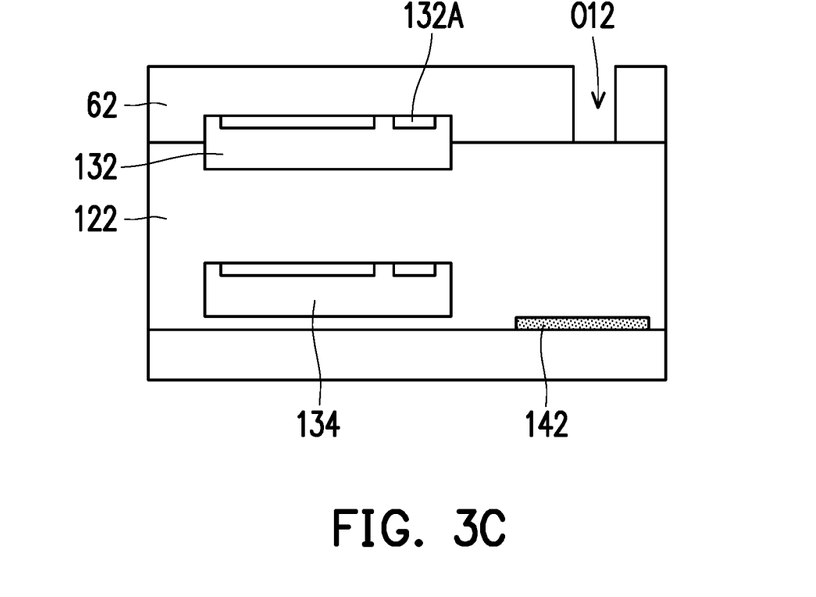
Figure 3D:
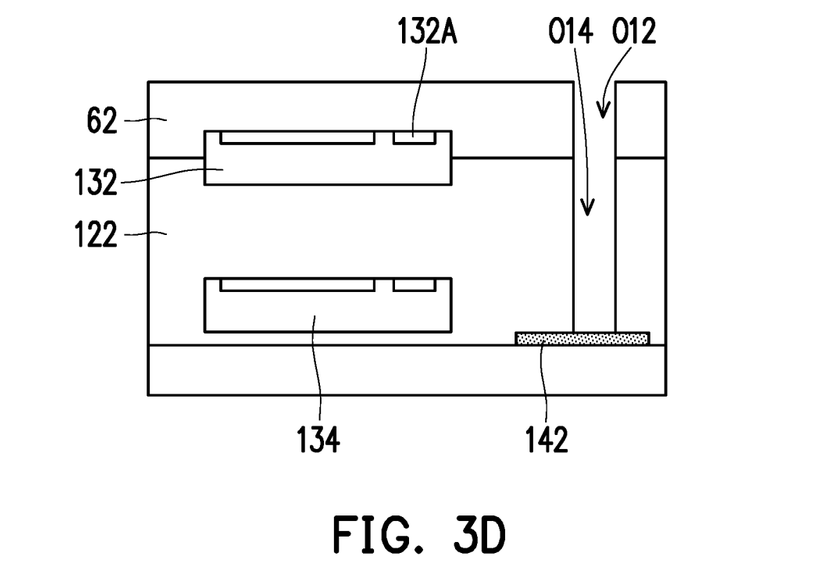
Figure 3E:
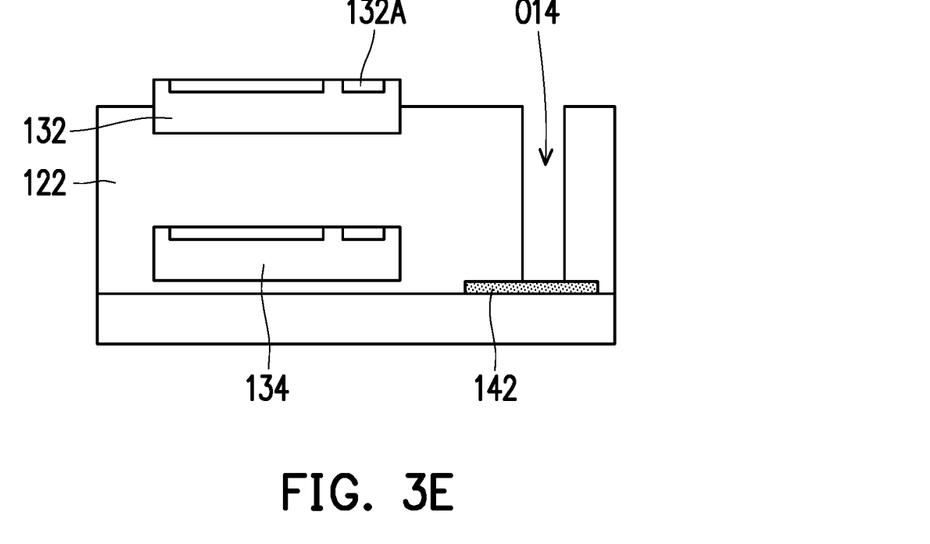

After the architectures as shown in FIG. 1F or FIG. 2C is completed, a wiring process may be continued. FIG. 3A to FIG. 3I is each a schematic cross-sectional diagram of a wiring process of a manufacturing method of a display device according to an embodiment of the disclosure. Referring to FIG. 3A, an architecture with only a first adhesion layer 122 is used as an example herein, which may also be applied to the embodiment with the second adhesion layer 124. First, a photoresist layer 62 is covered, as shown in FIG. 3B. Next, as shown in FIG. 3C, a lithographic etching process is performed on the photoresist layer 62 to form an opening O12. A position of the opening O12 corresponds to a pad 142 on the substrate 110. Next, as shown in FIG. 3D, the photoresist layer 62 is used as a mask, a lithographic etching process is performed on the first adhesion layer 122 to form an opening O14. The opening O12 and the opening O14 jointly expose the pad 142. Next, as shown in FIG. 3E, the photoresist layer 62 is removed.

Figure 3F:
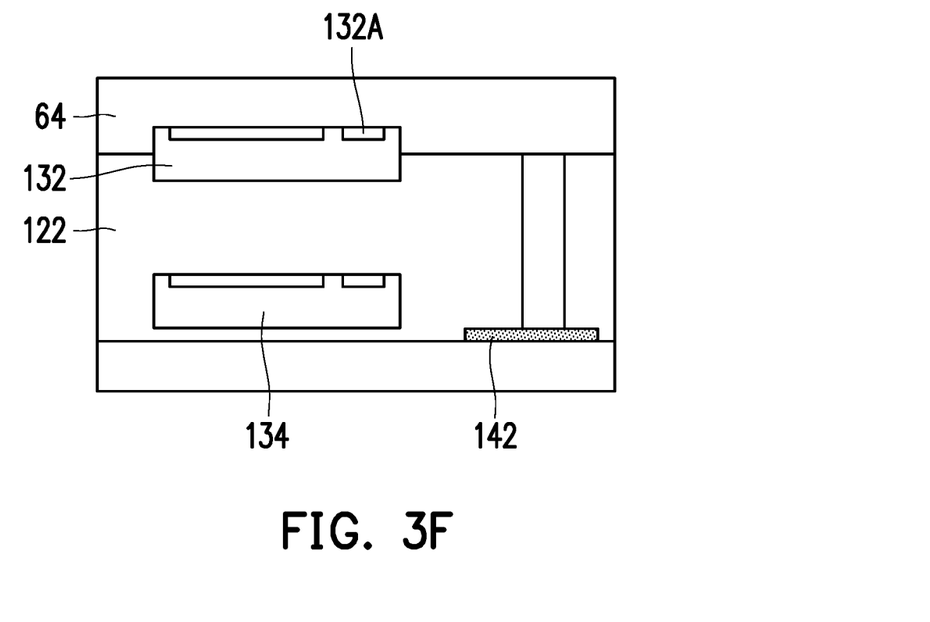
Figure 3G:
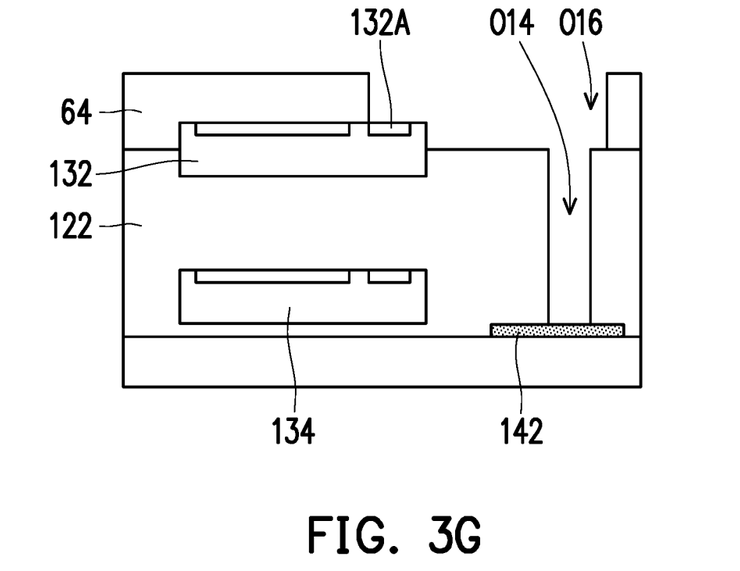
Figure 3H:
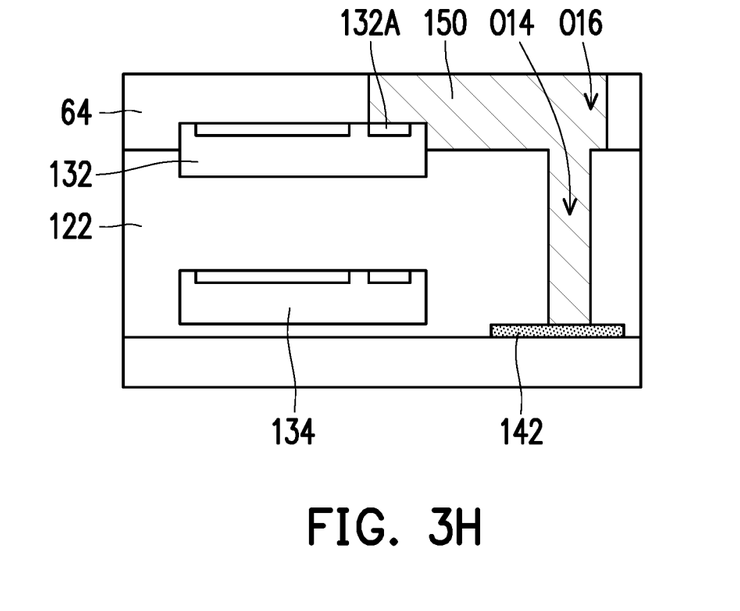
Figure 3I:
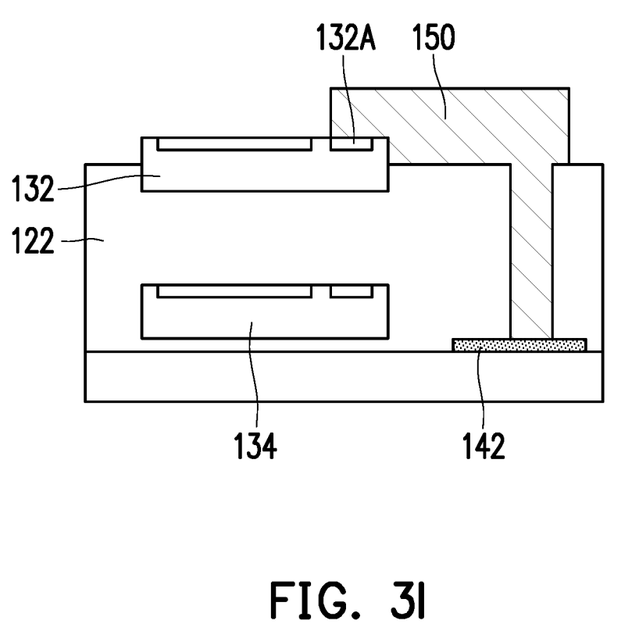

Then, as shown in FIG. 3F, a photoresist layer 64 is covered. Next, as shown in FIG. 3G, a lithographic etching process is performed on the photoresist layer 64 to form an opening O16. The opening O16 exposes one first electrode 132A of the first light-emitting element 132, the opening O14, and the pad 142. Next, as shown in FIG. 3H, the openings O16 and O14 are filled with a conductive material to form a wire 150. Both ends of the wire 150 are respectively in contact with the first electrode 132A and the pad 142 to make the two conductive. A material of the wire 150 may be metal, oxidized metal, or other conductive materials.

Figure 4A:
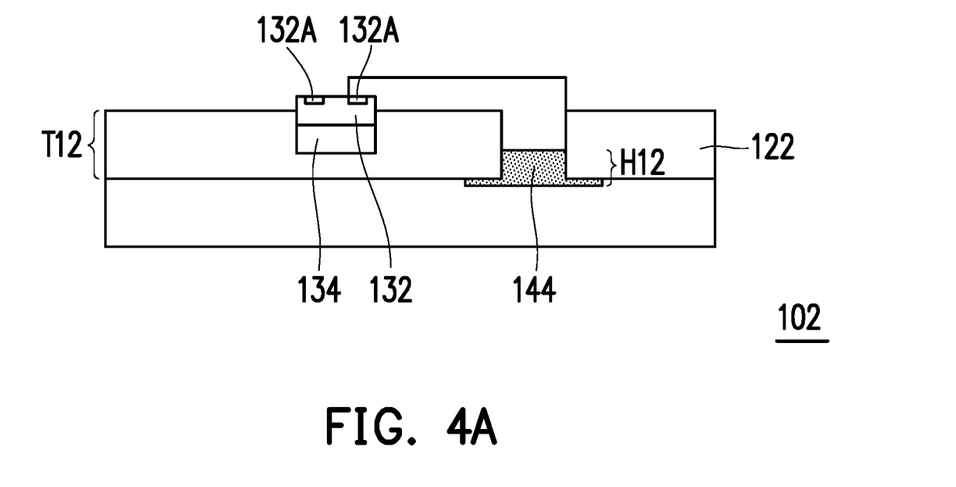
FIG. 4A to FIG. 4B is each a schematic partial cross-sectional diagram of a display device according to two embodiments of the disclosure.
Figure 4B:
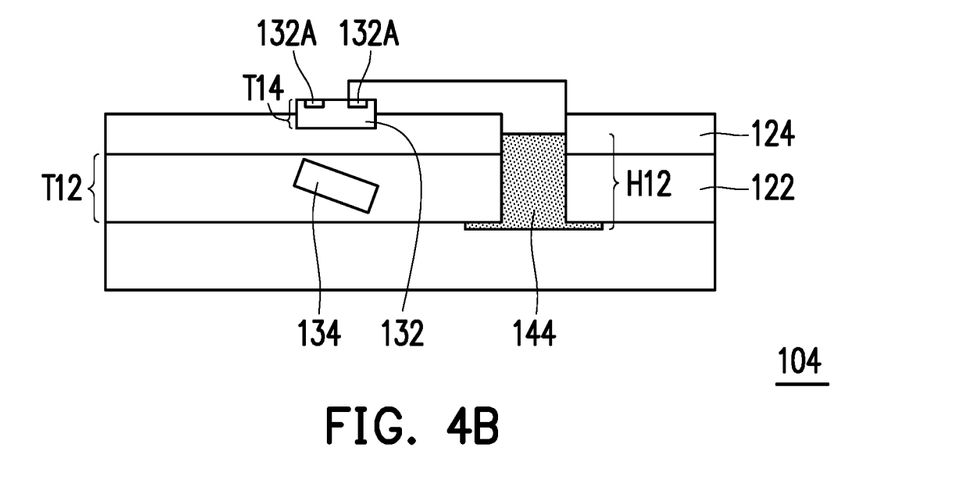

FIG. 4A to FIG. 4B is each a schematic partial cross-sectional diagram of a display device according to two embodiments of the disclosure. Referring to FIG. 4A, a display device 102 in this embodiment is substantially the same as the display device 100 of FIG. 1F, and only differences between the two are described herein. The display device 102 in this embodiment further includes a plurality of island-shaped pads 144, and only one of the island-shaped pads is shown in FIG. 4A. The first adhesion layer 122 has a plurality of openings O14, and only one of the openings is shown in FIG. 4A. Each of the island-shaped pads 144 is located in one corresponding opening O14. Each of the island-shaped pads 144 is electrically connected to one first electrode 132A of a corresponding first light-emitting element 132. A height H12 of each of the island-shaped pads 144 is smaller than or equal to a half of a thickness T12 of the first adhesion layer 122. The island-shaped pads 144 are disposed, so that a depth of a hole required to be excavated during the wiring process may be reduced, thereby shortening the process time, which may reduce the possibility that the first light-emitting elements 132 may be deviated or may have a tilted posture during the hole excavation.

Referring to FIG. 4B, a display device 104 in this embodiment is substantially the same as the display device of FIG. 2C, and only the differences between the two are described herein. The display device 104 in this embodiment further includes a plurality of island-shaped pads 144, and only one of the island-shaped pads is shown in FIG. 4B. A first adhesion layer 122 has a plurality of first openings O14, and only one of the first openings is shown in FIG. 4B. A second adhesion layer 124 has a plurality of second openings O18, and only one of the second openings is shown in FIG. 4B. Each of the first openings O14 overlaps a corresponding one of the second openings O18. Each of the island-shaped pads 144 is located in a corresponding first opening O14 and a corresponding second opening O18. Each of the island-shaped pads 144 is electrically connected to one first electrode 132A of a corresponding first light-emitting element 132. A height H12 of each of the island-shaped pads 144 is smaller than or equal to a sum of a thickness T12 of the first adhesion layer 122 and a thickness T14 of one first light-emitting element 132. In this embodiment, even if the first adhesion layer 122 and the second adhesion layer 124 both exist, the island-shaped pads 144 are disposed, so that a depth of a hole required to be excavated during the wiring may still be reduced, thereby shortening the process time, which may reduce the possibility that the first light-emitting elements 132 may be deviated or may have a tilted posture during the hole excavation.

Figure 5:
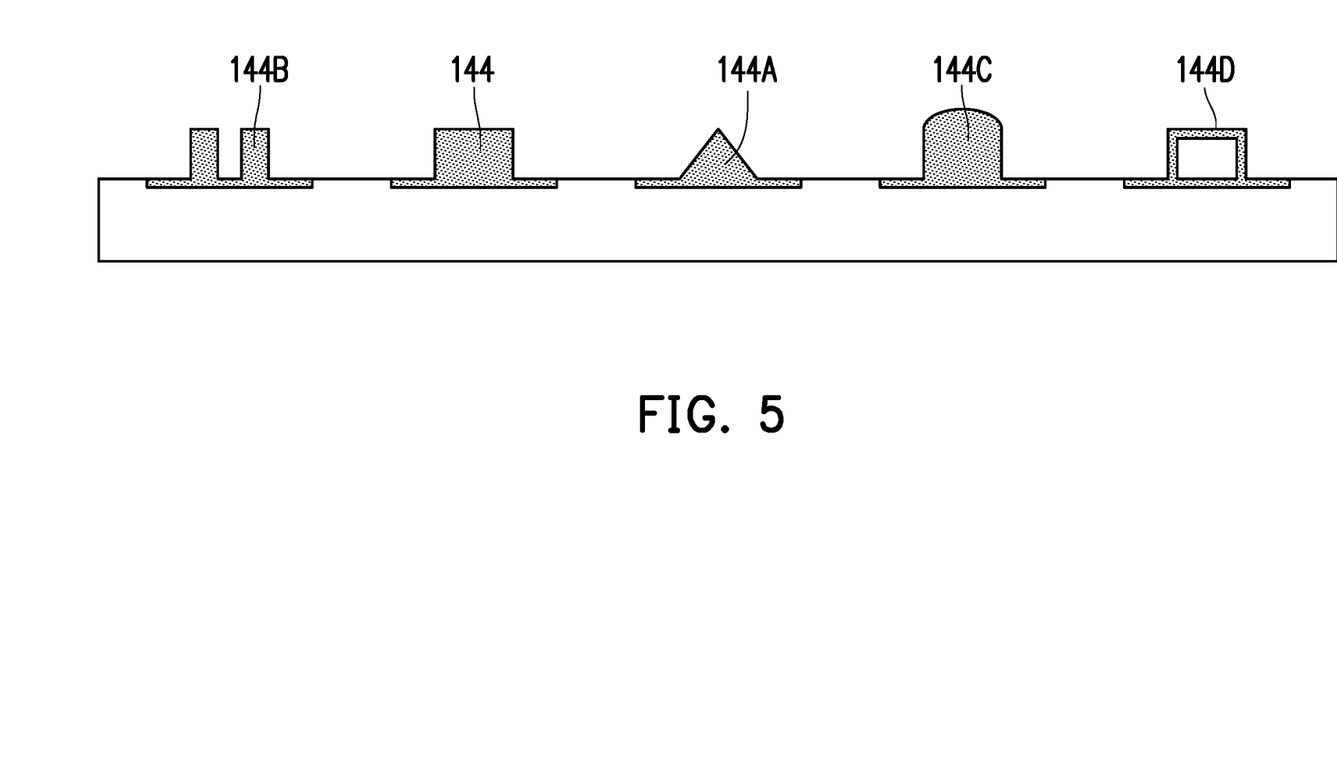
FIG. 5 is a schematic diagram of several types of pads of a display device according to an embodiment of the disclosure.

FIG. 5 is a schematic diagram of several types of pads of a display device according to an embodiment of the disclosure. Referring to FIG. 5, in addition to a cross-sectional shape of a main body of a rectangular island-shaped pad 144 the same as that shown in FIG. 4A and FIG. 4B, the pad may further be of a triangular cross-sectional shape of a main body of an island-shaped pad 144A, a cross-sectional shape of a main body of an island-shaped pad 144B with a hole excavated centrally, a cross-sectional shape of a main body of an island-shaped pad 144C with an arc-shaped top half, or other cross-sectional shapes. In addition, the main body of the island-shaped pad 144A may be formed of the same material, or the main body of an island-shaped pad 144D may be formed by a conductive material covering a non-conductive material coated with.

Figure 6:
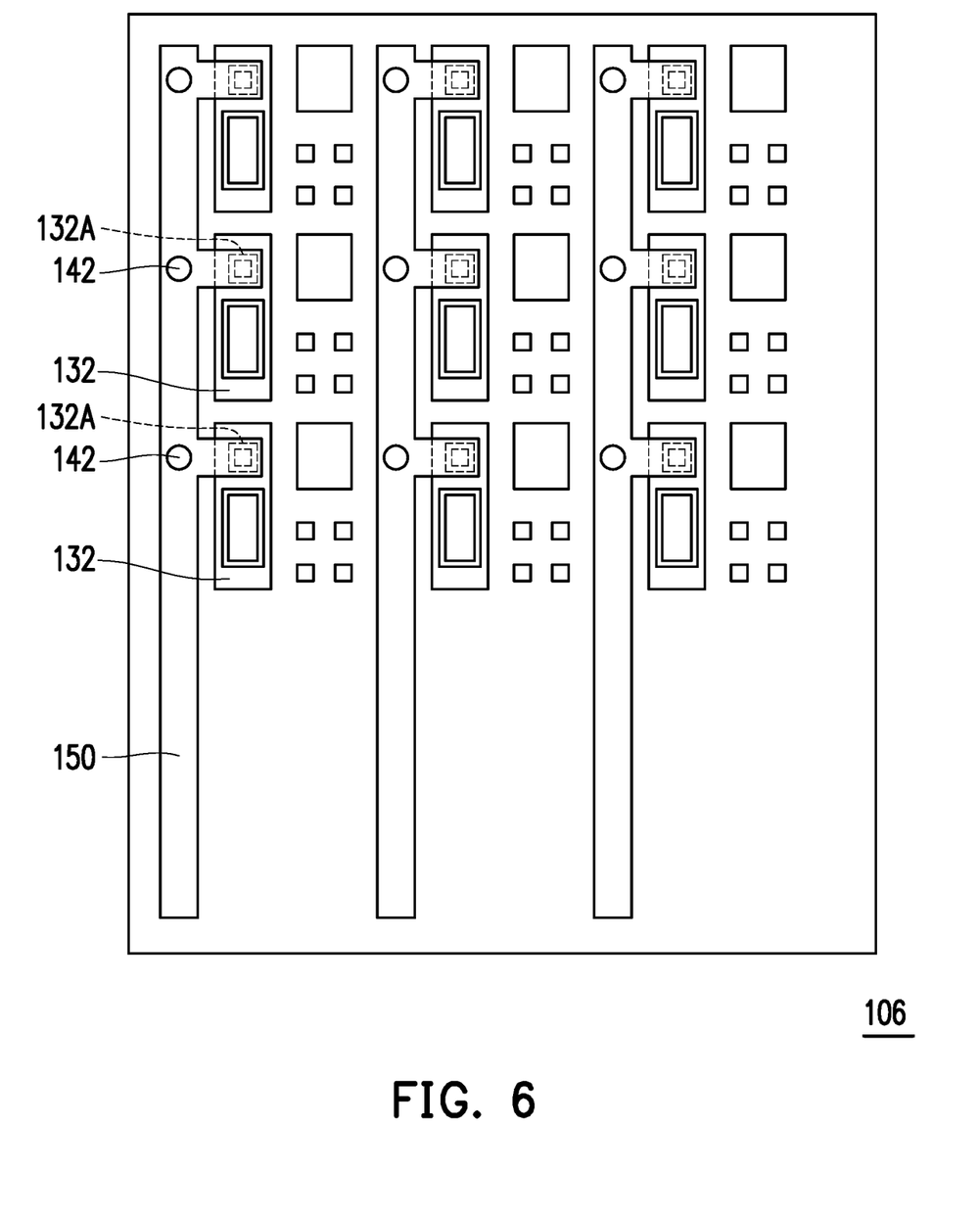
FIG. 6 is a schematic top view of a display device according to an embodiment of the disclosure.

FIG. 6 is a schematic top view of a display device according to an embodiment of the disclosure. FIG. 6 herein is used to describe a layout mode of a display device 106 in this embodiment. The technical means of the foregoing embodiments may be applied to the display device 106 of this embodiment. Referring to FIG. 6, the display device 106 includes a plurality of first light-emitting elements 132 arranged in an array. For example, the first light-emitting elements 132 are used to emit red light, green light, blue light, or other colored lights, respectively. There may be a plurality of pads 142 on a wire 150, and each of the pads 142 is connected to one first electrode 132A of a corresponding one of the first light-emitting elements 132. In this way, all of the first light-emitting elements 132 may be connected to a driving unit (not shown) through a plurality of wires 150.

Based on the foregoing, according to the display device and the manufacturing method of the display device in the disclosure, a light-emitting element with a poor posture is directly covered by a new light-emitting element instead of being removed. Therefore, the process time may be shortened, so that the manufacturing costs are reduced. In addition, according to the manufacturing method of the display device, the transfer head does not need to be replaced and the manufacturing speed may also be increased.

What is claimed is:

1. A display device, comprising:
  a substrate;
  a plurality of first light-emitting elements arranged on the substrate, wherein a plurality of first electrodes are provided on a surface of each of the plurality of first light-emitting elements facing away from the substrate;
  at least one second light-emitting element disposed on the substrate, wherein a plurality of second electrodes are provided on a surface of the second light-emitting element facing away from the substrate, and an orthographic projection of the second light-emitting element on the substrate partially overlaps an orthographic projection of a corresponding one of the plurality of first light-emitting elements on the substrate;
  an adhesion layer, wherein the plurality of first light-emitting elements and the second light-emitting element are fixed onto the substrate via the adhesion layer, and the adhesion layer has a plurality of openings; and
  a plurality of pads, each of which is located in a corresponding one of the openings and electrically connected to a corresponding one of the first electrodes.

2. The display device according to claim 1, wherein the second light-emitting element is located between the corresponding one of the plurality of first light-emitting elements and the substrate.

3. The display device according to claim 1, wherein a thickness of the adhesion layer is larger than a sum of a thickness of the corresponding one of the plurality of first light-emitting elements and a thickness of the second light-emitting element.

4. The display device according to claim 3, wherein the plurality of pads includes a plurality of island-shaped pads, and a height of each of the plurality of island-shaped pads is smaller than or equal to a half of the thickness of the adhesion layer.

5. The display device according to claim 1, wherein the adhesion layer comprises a first adhesion layer and a second adhesion layer, the first adhesion layer being located between the substrate and the second adhesion layer, the plurality of first light-emitting elements and the second light-emitting element being fixed onto the substrate via the first adhesion layer and the second adhesion layer, and the second light-emitting element being located between the first adhesion layer and the second adhesion layer.

6. The display device according to claim 5, wherein the plurality of pads includes a plurality of island-shaped pads, the first adhesion layer has a plurality of first openings, the second adhesion layer has a plurality of second openings, each of the plurality of first openings overlapping a corresponding one of the plurality of second openings, each of the plurality of island-shaped pads being located in a corresponding one of the plurality of first openings and a corresponding one of the plurality of second openings and being electrically connected to a corresponding one of the plurality of first electrodes, and a height of each of the plurality of island-shaped pads being smaller than or equal to a sum of a thickness of the first adhesion layer and a thickness of the corresponding one of the plurality of first light-emitting elements.

7. A display device, comprising:
a substrate;
a plurality of first light-emitting elements arranged on the substrate; and
at least one second light-emitting element disposed on the substrate, wherein the second light-emitting element is in a floating state, and an orthographic projection of the second light-emitting element on the substrate partially overlaps an orthographic projection of a corresponding one of the plurality of first light-emitting elements on the substrate.

8. The display device according to claim 7, wherein the second light-emitting element is located between the corresponding one of the plurality of first light-emitting elements and the substrate.

9. The display device according to claim 7, further comprising an adhesion layer, wherein the plurality of first light-emitting elements and the second light-emitting element are fixed onto the substrate via the adhesion layer, and a thickness of the adhesion layer is larger than a sum of a thickness of the corresponding one of the plurality of first light-emitting elements and a thickness of the second light-emitting element.

10. The display device according to claim 9, further comprising a plurality of island-shaped pads, wherein the adhesion layer has a plurality of openings, each of the plurality of island-shaped pads is located in a corresponding one of the plurality of openings, each of the plurality of island-shaped pads is electrically connected to a corresponding one of the plurality of first electrodes, and a height of each of the plurality of island-shaped pads is smaller than or equal to a half of the thickness of the adhesion layer.

11. The display device according to claim 7, further comprising a first adhesion layer and a second adhesion layer, the first adhesion layer being located between the substrate and the second adhesion layer, the plurality of first light-emitting elements and the second light-emitting element being fixed onto the substrate via the first adhesion layer and the second adhesion layer, and the second light-emitting element being located between the first adhesion layer and the second adhesion layer.

12. The display device according to claim 11, further comprising a plurality of island-shaped pads, wherein the first adhesion layer has a plurality of first openings, the second adhesion layer has a plurality of second openings, each of the plurality of first openings overlapping a corresponding one of the plurality of second openings, each of the plurality of island-shaped pads being located in a corresponding one of the plurality of first openings and a corresponding one of the plurality of second openings and being electrically connected to a corresponding one of the plurality of first electrodes, and a height of each of the plurality of island-shaped pads being smaller than or equal to a sum of a thickness of the first adhesion layer and a thickness of the corresponding one of the plurality of first light-emitting elements.

13. A manufacturing method of a display device, comprising:
performing, by using a transfer head, a plurality of first transfers to arrange a plurality of first light-emitting elements on a substrate, wherein a corresponding portion of the plurality of first light-emitting elements are transferred in each of the plurality of first transfers;
performing checking, and marking a position of at least one of the plurality of first light-emitting elements that has a poor posture; and
performing, by using the transfer head, a second transfer for the at least one of the plurality of first light-emitting elements that has the poor posture, such that the transfer head covers the at least one of the plurality of original first light-emitting elements that has the poor posture in an area involved during the second transfer by using a plurality of new first light-emitting elements.

14. The manufacturing method of the display device according to claim 13, wherein before the plurality of first transfers are performed, the method further comprises: forming a first adhesion layer on the substrate, and the plurality of first light-emitting elements are transferred onto the first adhesion layer through the plurality of first transfers.

15. The manufacturing method of the display device according to claim 14, wherein after the checking is performed and before the plurality of original first light-emitting elements are covered, the method further comprises: forming a second adhesion layer on the first adhesion layer, the second adhesion layer at least covers the at least one of the plurality of first light-emitting elements that has the poor posture.

* * * * *